US012197066B2

United States Patent
Kashiwagi et al.

(10) Patent No.: US 12,197,066 B2
(45) Date of Patent: Jan. 14, 2025

(54) OPTICAL FILM, OPTICAL-FILM-PROVIDED POLARIZING PLATE, AND DISPLAY DEVICE

(71) Applicant: Dai Nippon Printing Co., Ltd., Tokyo (JP)

(72) Inventors: Tsuyoshi Kashiwagi, Tokyo (JP); Takahiro Takeshima, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 365 days.

(21) Appl. No.: 17/758,582

(22) PCT Filed: Jan. 13, 2021

(86) PCT No.: PCT/JP2021/000923
§ 371 (c)(1),
(2) Date: Jul. 11, 2022

(87) PCT Pub. No.: WO2021/145349
PCT Pub. Date: Jul. 22, 2021

(65) Prior Publication Data
US 2023/0046640 A1 Feb. 16, 2023

(30) Foreign Application Priority Data
Jan. 16, 2020 (JP) ................. 2020-005356

(51) Int. Cl.
*G02F 1/1335* (2006.01)
*H10K 50/80* (2023.01)
*H10K 50/858* (2023.01)

(52) U.S. Cl.
CPC .. *G02F 1/133526* (2013.01); *G02F 1/133528* (2013.01); *H10K 50/858* (2023.02); *H10K 50/868* (2023.02)

(58) Field of Classification Search
None
See application file for complete search history.

(56) References Cited

U.S. PATENT DOCUMENTS 9,507,059 B2  11/2016 Shim et al.
2011/0128483 A1  6/2011 Park et al.
(Continued)

FOREIGN PATENT DOCUMENTS

CN  108022996 A  5/2018
JP  H07-043704 A  2/1995
(Continued)

OTHER PUBLICATIONS

Taiwanese Office Action (with English translation) dated Sep. 27, 2023 (Application No. 110101567).
(Continued)

*Primary Examiner* — Phu Vu
(74) *Attorney, Agent, or Firm* — BURR PATENT LAW, PLLC

(57) ABSTRACT

An optical film includes a low-refractive-index layer that includes a plurality of lens portions, and a high-refractive-index layer that fills a space between the plurality of lens portions. The lens portions each have a columnar shape and have a flat portion at an end thereof, and are arranged two-dimensionally. Distances between portions of the lens portions satisfy the following equation:

$((P_A-((A_{IN}+A_{EX})/2))\times(P_B-((B_{IN}+B_{EX})/2)))/(P_A\times P_B)$ is 0.42 or greater and 0.70 or less.

14 Claims, 6 Drawing Sheets

(56) References Cited

U.S. PATENT DOCUMENTS

| | | |
|---|---|---|
| 2012/0182506 A1 | 7/2012 | Park et al. |
| 2012/0286258 A1 | 11/2012 | Naraoka et al. |
| 2014/0175404 A1 | 6/2014 | Shim et al. |
| 2015/0043221 A1 | 2/2015 | Lee et al. |
| 2015/0144918 A1 | 5/2015 | Cho et al. |
| 2016/0187699 A1 | 6/2016 | Ju et al. |
| 2016/0252665 A1 | 9/2016 | Lee et al. |
| 2017/0207421 A1 | 7/2017 | Matsuzaki et al. |
| 2018/0045876 A1 | 2/2018 | Lee et al. |
| 2018/0120580 A1 | 5/2018 | Ouderkirk et al. |
| 2019/0285938 A1* | 9/2019 | Oh .................. G02F 1/1335 |
| 2020/0019014 A1 | 1/2020 | Oh et al. |
| 2020/0124909 A1 | 4/2020 | Ueba et al. |

FOREIGN PATENT DOCUMENTS

| | | |
|---|---|---|
| JP | 3272833 B2 | 4/2002 |
| JP | 3621959 B2 | 2/2005 |
| JP | 2011-118393 A | 6/2011 |
| JP | 2012-145944 A | 8/2012 |
| JP | 2014-123568 A | 7/2014 |
| JP | 2015-156275 A | 8/2015 |
| JP | 2016-126350 A | 7/2016 |
| JP | 2016-161943 A | 9/2016 |
| JP | 2018-205414 A | 12/2018 |
| JP | 2020-008858 A | 1/2020 |
| JP | 2020-016881 A | 1/2020 |
| WO | 2011/132773 A1 | 10/2011 |
| WO | 2016/047045 A1 | 3/2016 |
| WO | 2018/194114 A1 | 10/2018 |

OTHER PUBLICATIONS

English translation of the International Preliminary Report on Patentability (Chapter I) dated Jul. 28, 2022 (Application No. PCT/JP2021/000923).

International Search Report and Written Opinion (Application No. PCT/JP2021/000923) dated Mar. 16, 2021 (with English translation).

Japanese Office Action (Application No. 2020-002321) dated Nov. 19, 2021 (with English translation).

Japanese Office Action (Application No. 2020-002321) dated May 20, 2022 (with English translation).

International Search Report (Application No. PCT/JP2020/001375) dated Apr. 7, 2020 (in English).

English translation of International Preliminary Report on Patentabililty (Chapter I) (Application No. PCT/JP2020/001375) dated Jan. 27, 2022.

* cited by examiner

OPTICAL FILM, OPTICAL-FILM-PROVIDED POLARIZING PLATE, AND DISPLAY DEVICE

TECHNICAL FIELD

The present disclosure relates to an optical film that causes light exiting from a display surface of a display device to be subjected to an optical action. The present disclosure also relates to an optical-film-provided polarizing plate and a display device, which include the optical film.

BACKGROUND ART

A liquid crystal display device, which is an example of a display device, is used in various fields. Recently, an organic LED (organic light emitting diode) display device is also being widely used.

In a liquid crystal display device, the tone of an image within a viewing angle may change considerably due to, for example, a change in the intensity of light in accordance with a visibility angle, or leakage of light in an oblique direction.

On the other hand, in an organic LED display device, a blue shift tends to occur in an image that has been viewed obliquely. "Blue shift" refers to a phenomenon in which an image viewed in an oblique direction is bluer than an image viewed from the front. That is, even with regard to an image that is displayed by an organic LED display device, its tone within a viewing angle may change considerably due to, for example, such a blue shift. Note that a blue shift tends to markedly occur particularly in an organic LED display device using a microcavity structure.

A color change within a viewing angle as that described above can be a cause of reducing the display quality of an image. Another cause that influences the display quality can be, for example, variations in contrast within a viewing angle. Various technologies have been hitherto proposed for improving the display quality of an image. For example, JPH07-43704A, JP3272833A, JP3621959A, JP2016-126350A, JP2012-145944A, JP2011-118393A, and US9507059B each disclose an optical film that is provided at a display surface of a display device in order to improve the display quality of an image.

SUMMARY OF INVENTION

In an optical film of a related art, for example, light from a liquid crystal panel is reflected and/or refracted at an interface between two layers having different refractive indices to thereby diffuse the light. Such an optical film of the related art generally has a long lens portion extending between two ends of the film. In this structure, since, for example, die cutting is facilitated, the optical film is easily fabricated. However, although the effect of improving a display quality within a viewing angle occurs effectively in a direction orthogonal to a longitudinal direction of the lens portion, such an effect cannot be said to be large in the longitudinal direction of the lens portion. Therefore, such a structure cannot be said to be satisfactory when used in, for example, a smartphone or the like having an image rotation function.

On the other hand, U.S. Pat. No. 9,507,059B proposes an optical film having a plurality of columnar lens portions that are arranged two-dimensionally. In this structure, for example, improvement in a display quality can be expected in, for example, two directions, such as a left-right direction and an up-down direction. However, in the optical film in U.S. Pat. No. 9,507,059B, since the lens portions are small and the slopes have steep gradients, a state in which light is not sufficiently dispersed over a wide angle range may occur. Further, trough portions and ends between the lens portions are rounded, and light that is parallel to a front view direction may be undesirably diffused, as a result of which the display quality in front view, for example, the luminance level may undesirably be adversely affected.

The present disclosure has been made considering the above-described circumstances, and an object of the present disclosure is to provide an optical film that is capable of effectively suppressing a color change within a viewing angle while maintaining a good display quality in front view of a display device, and an optical-film-provided polarizing plate and a display device, which include the optical film.

An optical film according to the present disclosure includes a low-refractive-index layer that includes a plurality of lens portions, and a high-refractive-index layer that is provided so as to fill a space between the plurality of lens portions, and that has a refractive index higher than a refractive index of the low-refractive-index layer. In the optical film, each lens portion has a columnar shape tapering toward a side of the high-refractive-index layer, and has a flat portion at an end thereof on the side of the high-refractive-index layer, the flat portion being parallel to a film surface of the optical film, the plurality of lens portions are arranged two-dimensionally in a first direction that is parallel to the film surface and in a second direction that is orthogonal to the first direction, and when a distance in the first direction between the flat portions of the lens portions that are adjacent to each other in the first direction is $A_{IN}$, when a distance in the first direction between end portions of the lens portions that are adjacent to each other in the first direction is $A_{EX}$, the end portions being situated on a side opposite to the flat portions, when a first-direction pitch that is a distance in the first direction between midpoints in the first direction of the lens portions that are adjacent to each other in the first direction is $P_A$, when a distance in the second direction between the flat portions of the lens portions that are adjacent to each other in the second direction is $B_{IN}$, when a distance in the second direction between end portions of the lens portions that are adjacent to each other in the second direction is $B_{EX}$, the end portions being situated on the side opposite to the flat portions, and when a second-direction pitch that is a distance in the second direction between midpoints in the second direction of the lens portions that are adjacent to each other in the second direction is $P_B$, $((P_A-((A_{IN}+A_{EX})/2))\times(P_B-((B_{IN}+B_{EX})/2)))/(P_A\times P_B)$ is 0.42 or greater and 0.70 or less.

When a height of each lens portion is H, $H/((A_{IN}+A_{EX})/2)$ and $H/((B_{IN}+B_{EX})/2)$ may each be 1.40 or greater and 3.00 or less.

An optical film according to the present disclosure includes a low-refractive-index layer that includes a plurality of lens portions, and a high-refractive-index layer that is provided so as to fill a space between the plurality of lens portions, and that has a refractive index higher than a refractive index of the low-refractive-index layer. In the optical film, each lens portion has a columnar shape tapering toward a side of the high-refractive-index layer, and includes a flat portion at an end thereof on the side of the high-refractive-index layer, the flat portion being parallel to a film surface of the optical film, the plurality of lens portions are arranged two-dimensionally in a first direction that is parallel to the film surface and in a second direction that is orthogonal to the first direction, and when a distance in the first direction between the flat portions of the lens portions that are adjacent to each other in the first direction is $A_{IN}$, a distance in the first direction between end portions of the lens portions that are adjacent to each other in the first direction is $A_{EX}$, the end portions being situated on a side opposite to the flat portions, a distance in the second direction between the flat portions of the lens portions that are adjacent to each other in the second direction is $B_{IN}$, a distance in the second direction between end portions of the lens portions that are adjacent to each other in the second direction is $B_{EX}$, the end portions being situated on the side opposite to the flat portions, and a height of each lens portion is H, $H/((A_{IN}+A_{EX})/2)$ and $H/((B_{IN}+B_{EX})/2)$ are each 1.40 or greater and 3.00 or less.

In the optical film according to the present disclosure, the flat portions of the lens portions may be disposed so as to face a side of a display panel.

The plurality of lens portions may be arranged in a matrix, and the high-refractive-index layer may include a double-cross-shape portion (a portion arraying plurality of two pairs of parallel lines crisscrossing to form a stylized).

Each lens portion may have a quadrangular pyramidal shape, and each flat portion may have a square shape.

Each lens portion may have a quadrangular pyramidal shape, and each flat portion may have a rectangular shape.

A side surface of each lens portion may be a curved surface that protrudes toward the side of the high-refractive-index layer.

An optical film according to the present disclosure includes a low-refractive-index layer that includes a plurality of lens portions, and a high-refractive-index layer that is provided so as to fill a space between the plurality of lens portions, and that has a refractive index higher than a refractive index of the low-refractive-index layer. In the optical film, each lens portion has a columnar shape tapering toward one side of the optical film, the one side being a side in a normal direction to a film surface of the optical film, and includes a flat portion at an end thereof on the one side, the flat portion being parallel to the film surface, the plurality of lens portions are arranged two-dimensionally in a first direction that is parallel to the film surface and in a second direction that is orthogonal to the first direction, and when a distance in the first direction between the flat portions of the lens portions that are adjacent to each other in the first direction is $A_{IN}$, when a distance in the first direction between end portions of the lens portions that are adjacent to each other in the first direction is $A_{EX}$, the end portions being situated on a side opposite to the flat portions, when a first-direction pitch that is a distance in the first direction between midpoints in the first direction of the lens portions that are adjacent to each other in the first direction is $P_A$, when a distance in the second direction between the flat portions of the lens portions that are adjacent to each other in the second direction is $B_{IN}$, when a distance in the second direction between end portions of the lens portions that are adjacent to each other in the second direction is $B_{EX}$, the end portions being situated on the side opposite to the flat portions, and when a second-direction pitch that is a distance in the second direction between midpoints in the second direction of the lens portions that are adjacent to each other in the second direction is $P_B$, $((P_A-((A_{IN}+A_{EX})/2))\times(P_B-((B_{IN}+B_{EX})/2)))/(P_A\times P_B)$ is 0.42 or greater and 0.70 or less.

In the optical film, when a height of each lens portion is H, $H/((A_{IN}+A_{EX})/2)$ and $H/((B_{IN}+B_{EX})/2)$ are each 1.40 or greater and 3.00 or less.

An optical film according to the present disclosure includes a low-refractive-index layer that includes a plurality of lens portions, and a high-refractive-index layer that is provided so as to fill a space between the plurality of lens portions, and that has a refractive index higher than a refractive index of the low-refractive-index layer. In the optical film, each lens portion has a columnar shape tapering toward one side of the optical film, the one side being a side in a normal direction to a film surface of the optical film, and includes a flat portion at an end thereof on the one side, the flat portion being parallel to the film surface, the plurality of lens portions are arranged two-dimensionally in a first direction that is parallel to the film surface and in a second direction that is orthogonal to the first direction, and when a distance in the first direction between the flat portions of the lens portions that are adjacent to each other in the first direction is $A_{IN}$, a distance in the first direction between end portions of the lens portions that are adjacent to each other in the first direction is $A_{EX}$, the end portions being situated on a side opposite to the flat portions, a distance in the second direction between the flat portions of the lens portions that are adjacent to each other in the second direction is $B_{IN}$, a distance in the second direction between end portions of the lens portions that are adjacent to each other in the second direction is $B_{EX}$, the end portions being situated on the side opposite to the flat portions, and a height of each lens portion is H, $H/((A_{IN}+A_{EX})/2)$ and $H/((B_{IN}+B_{EX})/2)$ are each 1.40 or greater and 3.00 or less.

A display device according to the present disclosure includes
any one of the optical films; and
an organic LED panel having the optical film provided at a display surface.

A display device according to the present disclosure includes
any one of the optical films; and
a liquid crystal panel having the optical film provided at a display surface.

An optical-film-provided polarizing plate according to the present disclosure includes
any one of the optical films; and
the polarizing plate adhered to the optical film.

According to the present disclosure, it is possible to effectively suppress a color change within a viewing angle while maintaining a good display quality in front view of the display device.

DESCRIPTION OF EMBODIMENTS

Each embodiment of the present disclosure is described below with reference to the drawings.

Note that, in the description, terms such as "sheet", "film", and "plate" are not distinguished from each other based on only differences in names. Therefore, for example, "sheet" is a concept including a member that can be called "film" or "plate". In addition, in the description, "sheet surface (plate surface, film surface)" refers to a surface that corresponds to a planar direction (surface direction) of an object sheet member when the object sheet member is entirely or broadly viewed. Note that, "sheet surface (plate surface, film surface)" may be called a main surface. Further, in the description, "normal direction to a sheet member" refers to a normal direction to the sheet surface of the object sheet member.

First Embodiment

Figure 1:
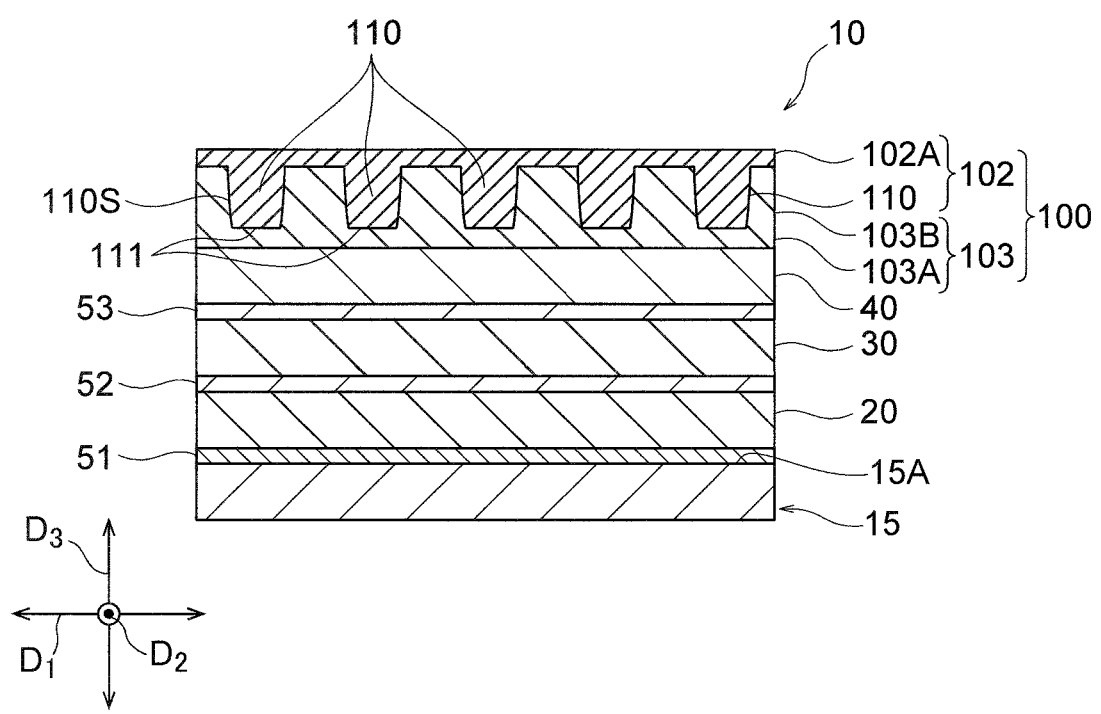
FIG. 1 is a schematic view of a structure of a display device including an optical film according to a first embodiment of the present disclosure.

FIG. 1 is a schematic view of a structure of a display device 10 including an optical film 100 according to a first embodiment. The display device 10 includes an organic LED (organic light emitting diode) panel 15, a circularly polarizing plate 20, a touch panel 30, a cover glass 40, and the optical film 100, which are stacked in this order. As one example, the display device 10 according to the embodiment is formed as a smartphone. However, the display device 10 may be a tablet terminal (tablet device), a television, a computer display, or a car navigation system.

A display surface (front surface) 15A of the organic LED panel 15 and a back surface of the circularly polarizing plate 20 are adhered to each other with a first adhesive layer 51.

A front surface of the circularly polarizing plate 20 and a back surface of the touch panel 30 are adhered to each other with a second adhesive layer 52. A front surface of the touch panel 30 and a back surface of the cover glass 40 are adhered to each other with a third adhesive layer 53. The adhesive layers 51 to 53 are each a so-called OCA (optical clear adhesive), and each have a high light transmittance.

The optical film 100 is disposed on a front surface of the cover glass 40. In the embodiment, although the optical film 100 and the cover glass 40 are not adhered to each other with an adhesive layer, the optical film 100 and the cover glass 40 may be adhered to each other with an adhesive layer.

In FIG. 1 and the figures used in the description below, symbol $D_1$ denotes a first direction that is a direction parallel to a film surface of the optical film 100. Symbol $D_2$ denotes a second direction that is a direction parallel to the film surface of the optical film 100 and orthogonal to the first direction $D_1$. Symbol $D_3$ denotes a third direction that is orthogonal to both the first direction $D_1$ and the second direction $D_2$.

Although the organic LED panel 15 is an organic LED panel having a microcavity structure, the organic LED panel 15 may have another structure. In general, in a LED panel, a blue shift tends to occur in an image viewed obliquely. Such a blue shift tends to noticeably occur particularly in an organic LED panel having a microcavity structure. Therefore, in the display device 10, a color change within a viewing angle is suppressed by the optical film 100.

In the embodiment, the circularly polarizing plate 20, the touch panel 30, and the cover glass 40 are disposed between the organic LED panel 15 and the optical film 100. The circularly polarizing plate 20 has a polarizer and a phase difference plate. The phase difference plate is disposed on a side of the organic LED panel 15, and the polarizer is joined to a surface of the phase difference plate on a side opposite to the organic LED panel 15. Specifically, the polarizer is a linear polarizer, and the phase difference plate is a λ/4 phase difference plate. The touch panel 30 is a panel including a transparent glass plate. It is desirable that the touch panel 30 be a capacitive touch panel. The cover glass 40 has a protection function. However, the cover glass 40 may have other functions, such as a reflection preventing function.

The optical film 100 includes a low-refractive-index layer 102 and a high-refractive-index layer 103 that are adhered to each other. Although a base material is not disposed on a side of the low-refractive-index layer 102 opposite to the high-refractive-index layer 103, such a base material may be provided.

Figure 2:
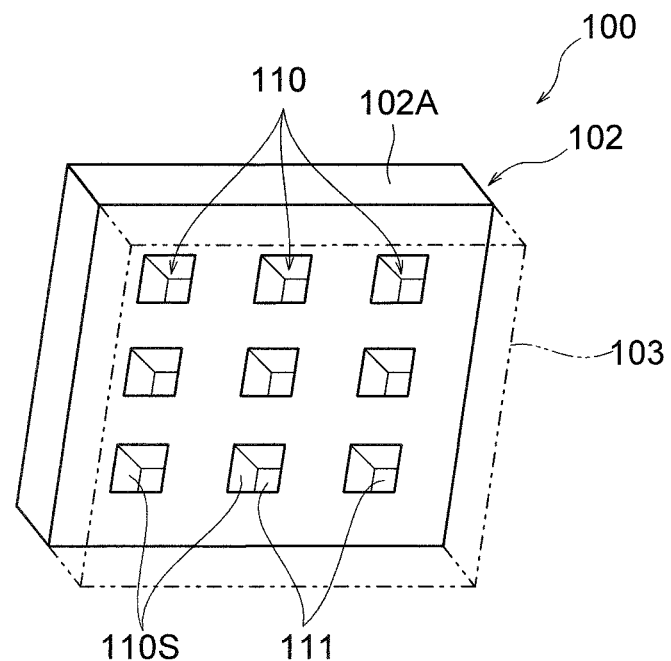
FIG. 2 is a partial perspective view of the optical film of the display device shown in FIG. 1.
Figure 3:
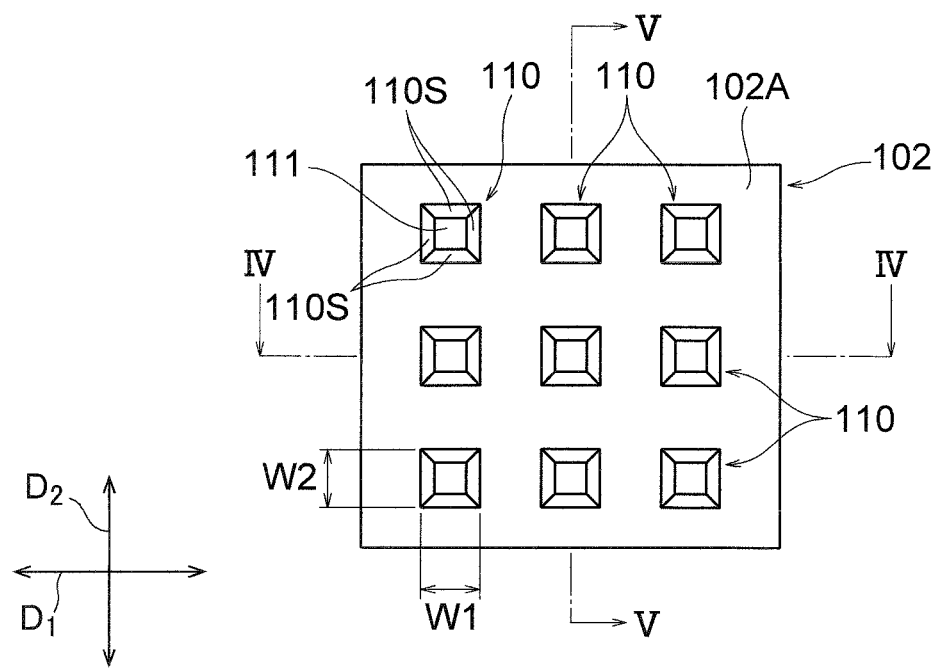
FIG. 3 is a schematic view of an arrangement of lens portions of a low-refractive-index layer of the optical film shown in FIG. 2.
Figure 4:
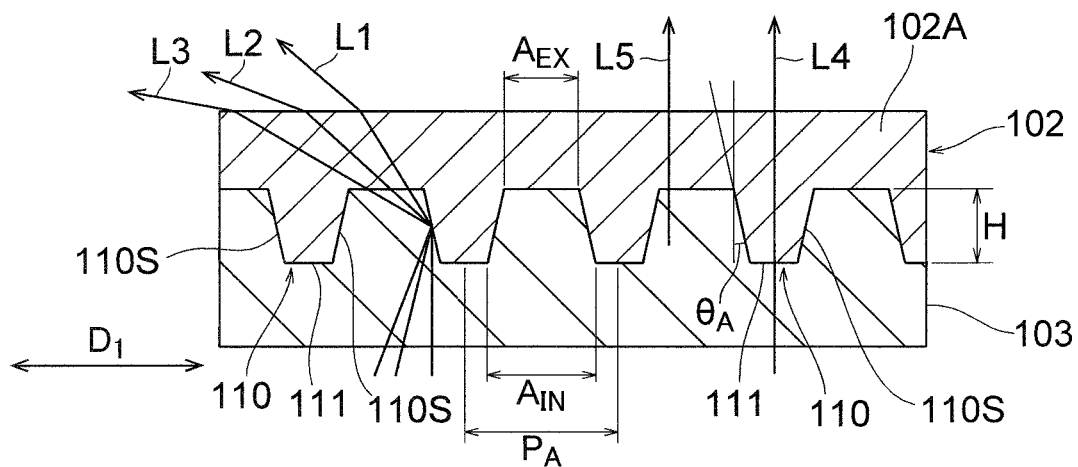
FIG. 4 is a sectional view when the optical film has been cut in a direction along line IV-IV in FIG. 3.
Figure 5:
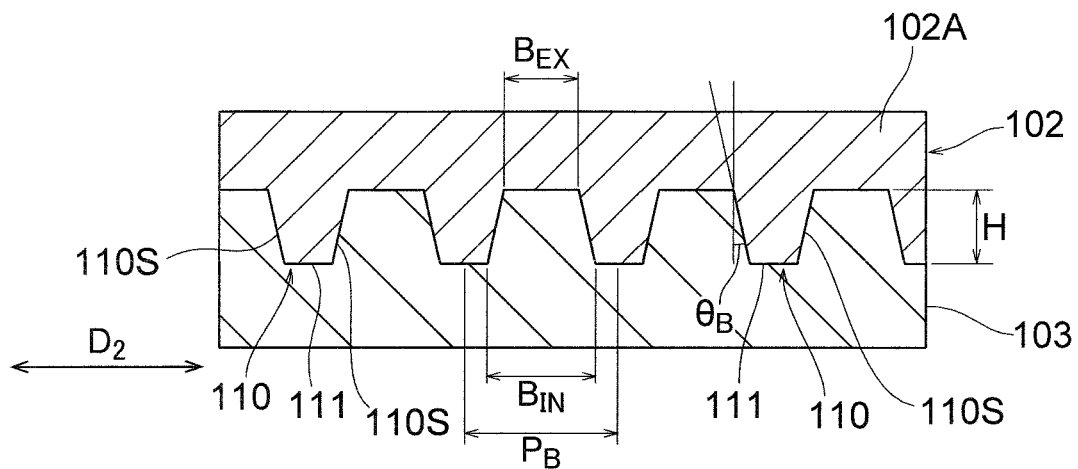
FIG. 5 is a sectional view when the optical film has been cut in a direction along line V-V in FIG. 3.

FIG. 2 is a partial perspective view of the optical film 100. In FIG. 2, for explanatory convenience, the high-refractive-index layer 103 is shown by alternate long and two short dash lines. FIG. 3 shows the low-refractive-index layer 102 when viewed in a normal direction thereto, that is, when viewed in the third direction $D_3$. FIG. 3 is a schematic view of an arrangement of lens portions 110 (described later) of the low-refractive-index layer 102. FIG. 4 is a sectional view when the optical film 100 has been cut in a direction along line IV-IV in FIG. 3. FIG. 5 is a sectional view when the optical film 100 has been cut in a direction along line V-V in FIG. 3.

The low-refractive-index layer 102 has a film-like layer body 102A and the plurality of lens portions 110, which are integrated with each other, the layer body 102A having a front surface and a back surface, and the plurality of lens portions 110 being disposed two-dimensionally on the back surface of the layer body 102A in the first direction $D_1$ and the second direction $D_2$. On the other hand, the highrefractive-index layer 103 is stacked on the low-refractive-index layer 102 so as to cover the lens portions 110 and to fill a space between the plurality of lens portions 110. Therefore, in the embodiment, an interface between the low-refractive-index layer 102 and the high-refractive-index layer 103 has an uneven shape. The high-refractive-index layer 103 has a film shape having a plurality of holes that accommodate the plurality of lens portions 110, and, more specifically, has a double-cross shape or a lattice shape.

Specifically, the high-refractive-index layer 103 has a film-like layer body 103A having a front surface and a back surface, and a double-cross-shape portion 103B. The double-cross-shape portion 103B is integrated with the front surface of the layer body 103A facing the low-refractive-index layer 102. When viewed in the third direction $D_3$, the double-cross-shape portion 103B has a double-cross shape (grid shape, hash shape, or the like). Note that the low-refractive-index layer 102 may include a group of lens portions 110 without having the layer body 102A. The high-refractive-index layer 103 may include only the double-cross-shape portion 103B without having the layer body 103A.

As shown in FIG. 3, the lens portions 110 are arranged two-dimensionally in a matrix, and, specifically, rows of the plurality of lens portions 110 that are disposed side by side at equal intervals in the first direction $D_1$ are disposed side by side at equal intervals in the second direction $D_2$. In the embodiment, the plurality of lens portions 110 all have the same shape. The lens portions 110 that are adjacent to each other in the second direction $D_2$ face each other in the second direction $D_2$ without being displaced in the first direction $D_1$.

Each lens portion 110 has a columnar shape tapering toward a lower side in FIG. 1 of the optical film 100, the lower side being one side of the optical film 100 in a normal direction to the film surface. Each lens portion 110 includes a flat portion 111 at an end thereof on a side of the high-refractive-index layer 103, which is the one side in the normal direction, the flat portion 111 extending in a surface direction of the low-refractive-index layer 102 and the high-refractive-index layer 103, that is, along the film surface of the optical film 100. Specifically, each lens portion 110 has a quadrangular pyramidal shape, specifically, a regular quadrangular pyramidal shape; and each flat portion 111 has a rectangular shape, more specifically, a square shape. On the other hand, each lens portion 110 includes four side surfaces 110S that are positioned between the flat portion 111 and the layer body 102A and that are connected to each other so as to form a rectangular shape.

As shown in FIG. 4, two side surfaces 110S facing each other in the first direction $D_1$ via the flat portion 111 therebetween taper toward a side of the high-refractive-index layer 103. As shown in FIG. 5, two side surfaces 110S facing each other in the second direction $D_2$ via the flat portion 111 therebetween also taper toward the side of the high-refractive-index layer 103. The four side surfaces 110S are each a curved surface that protrudes toward the side of the high-refractive-index layer 103.

Each side surface 110S may be a curved surface that has an arc shape in sectional view and that protrudes toward the side of the high-refractive-index layer 103, or a curved surface that has an elliptical arc shape and that protrudes toward the side of the high-refractive-index layer 103. Each side surface 110S may be a bent surface that protrudes toward the side of the high-refractive-index layer 103. Each side surface 110S may be a curved surface or a bent surface that protrudes toward the side of the low-refractive-index layer 102, or may be a flat surface.

Although clear from the figures, the optical film 100 of the embodiment is disposed so that the high-refractive-index layer 103 faces the organic LED panel 15. In other words, the optical film 100 is disposed so that the flat portion 111 of each lens portion 110 faces the organic LED panel 15. Therefore, the high-refractive-index layer 103 is positioned on a side of incidence light from the organic LED panel 15, and the low-refractive-index layer 102 is positioned on a side of exiting light.

Symbol $A_{IN}$, symbol $A_{EX}$, and symbol $P_A$ shown in FIG. 4 stand for the following.

$A_{IN}$: a first-direction high-refractive-index-side incidence width that is a distance in the first direction $D_1$ between the flat portions 111 of lens portions 110 that are adjacent to each other in the first direction $D_1$.

$A_{EX}$: a first-direction high-refractive-index-side exiting width that is a distance in the first direction $D_1$ between end portions of lens portions 110 that are adjacent to each other in the first direction $D_1$, the end portions being situated on a side opposite to the flat portions 111.

$P_A$: a first-direction pitch that is a distance in the first direction $D_1$ between midpoints in the first direction $D_1$ of lens portions 110 that are adjacent to each other in the first direction $D_1$.

Symbol $B_{IN}$, symbol $B_{EX}$, and symbol $P_B$ shown in FIG. 5 stand for the following.

$B_{IN}$: a second-direction high-refractive-index-side incidence width that is a distance in the second direction $D_2$ between the flat portions 111 of lens portions 110 that are adjacent to each other in the second direction $D_2$.

$B_{EX}$: a second-direction high-refractive-index-side exiting width that is a distance in the second direction $D_2$ between end portions of lens portions 110 that are adjacent to each other in the second direction $D_2$, the end portions being situated on a side opposite to the flat portions 111.

$P_B$: a second-direction pitch that is a distance in the second direction $D_2$ between midpoints in the second direction $D_2$ of lens portions 110 that are adjacent to each other in the second direction $D_2$.

Symbol H in FIGS. 4 and 5 denotes the height of a lens portion 110.

Here, the optical film 100 according to the embodiment satisfies the relationships of Condition (1) and Condition (2) below.

$((P_A-((A_{IN}+A_{EX})/2))\times(P_B-((B_{IN}+B_{EX})/2)))/(P_A\times P_B)$ is 0.42 or greater and 0.70 or less   Condition (1)

$H/((A_{IN}+A_{EX})/2)$, and $H/((B_{IN}+B_{EX})/2)$ are each 1.40 or greater and 3.00 or less   Condition (2)

Note that, below, $((P_A-((A_{IN}+A_{EX})/2))\times(P_B-((B_{IN}+B_{EX})/2)))/(P_A\times P_B)$ in Condition (1) is called a "slope ratio".

$H/((A_{IN}+A_{EX})/2)$ in Condition (2) is called an average aspect in sectional view in the first direction, and $H/((B_{IN}+B_{EX})/2)$ in Condition (2) is called an average aspect in sectional view in the second direction.

The inventor of the present disclosure has found out that, when Condition (1) or (2) above is satisfied, color change within a viewing angle can be effectively suppressed while maintaining a good display quality in front view of the display device 10. The inventor of the present disclosure also found out that, when Conditions (1) and (2) are satisfied at the same time, such an effect can be further increased.

The optical film 100 totally reflects at the side surfaces 110S of the lens portions 110, for example, light beams L1 to L3 shown in FIG. 4 from the organic LED panel 15, and diffuses the totally reflected light beams in a wide angle range on a high angle side. Here, when the lens portions 110 are small, the quantity of light that can be totally reflected by the side surfaces 110S may be reduced. When the lens portions 110 are small and the side surfaces 110S have a steep gradient, light can no longer by diffused in a wide range. When the side surfaces 110S have a steep gradient and ends of the lens portions 110 are pointed or rounded, light parallel to a front view direction may be undesirably diffused. As a result of, while considering these matters, carrying out assiduous research regarding, for example, the shape/size of the lens portions 110, the inventor of the present disclosure arrived at Conditions (1) and (2) above.

More specifically, when light exiting to the outside from the organic LED panel 15 via the optical film 100 was observed in a front view direction of the display device 10 parallel to the third direction $D_3$ and in a direction that was 45 degrees with respect to the front view direction in a plane including the front view direction and the first direction $D_1$, and when color change Δu'v' of light exiting in the 45-degree direction with respect to the color of light exiting in the front view direction was calculated, it was found that the color change Δu'v' with the optical film 100 could be 75% or less of the color change without the optical film 100.

Similarly, when light exiting to the outside from the organic LED panel 15 via the optical film 100 was observed in the front view direction of the display device 10 parallel to the third direction $D_3$ and in a direction that was 45 degrees with respect to the front view direction in a plane including the front view direction and the second direction $D_2$, and when color change Δu'v' of light exiting in the 45-degree direction with respect to the color of light exiting in the front view direction was calculated, it was found that the color change Δu'v' with the optical film 100 could be 75% or less of the color change without the optical film 100.

Note that the color change Δu'v' indicates a color difference, and, in the embodiment, the smaller this value is, the smaller the color difference with respect to light exiting in the front view direction. The color change Δu'v' is calculated from the color prescribed by u' and v' in a uniform color space. A value of Δu'v' at an angle θ within a certain viewing angle is expressed by the following Formula (1). By substituting the value of 45 degrees for θ in Formula (1), the color change at a visibility angle of 45 degrees can be determined.

[Formula 1]

$$\Delta u'v'(\theta)=\sqrt{(u'(\theta)-u'(0))^2-(v'(\theta)-v'(0))^2} \quad (1)$$

u' and v' that are color coordinates of the uniform color space in Formula (1) are expressed by the following Formula (2-1) and Formula (2-2), respectively.

[Formula 2]

$$u' = \frac{4x}{-2x+12y+3} \quad (2\text{-}1)$$

$$v' = \frac{9y}{-2x+12y+3} \quad (2\text{-}2)$$

Here, in each of the formulas above, x and y denote color coordinates that are prescribed by a CIE1931 color space (CIE xyY color space).

Symbol $\theta_A$ in FIG. 4 denotes an acute angle formed by a straight line with respect to the third direction $D_3$, the straight line passing through an end point of a side surface 110S on a side of the high-refractive-index layer 103 and through an opposite end point. Symbol $\theta_B$ in FIG. 5 denotes an acute angle formed by a straight line with respect to the third direction $D_3$, the straight line passing through an end point of a side surface 110S on the side of the high-refractive-index layer 103 and through an opposite end point. Under the condition that Conditions (1) and (2) above are satisfied, the angles $\theta_A$ and $\theta_B$ are determined to be in a range greater than 0 degrees and 15 degrees or less. The angles $\theta_A$ and $\theta_B$ are preferably greater than 0 degrees and 10 degrees or less, and more preferably 5 degrees or greater and 10 degrees or less. When the angles $\theta_A$ and $\theta_B$ become 0 degrees or less, a problem that releasing from a die becomes difficult occurs. When the angles $\theta_A$ and $\theta_B$ become 15 degrees or greater, light totally reflected at a side surface 110S may propagate in an excessively oblique manner, and thus a problem that front luminance is reduced may occur. Note that the angles $\theta_A$ and $\theta_B$ correspond to "slope angle average" in, for example, Table 1 below.

In order to satisfy Conditions (1) and (2) above, it is preferable that the first-direction high-refractive-index-side incidence width $A_{IN}$ and the first-direction high-refractive-index-side exiting width $A_{EX}$ be such that the relationship in which $((A_{IN}-A_{EX})\times2)/P_A$ is 0.2 or greater and 0.5 or less (in percentage, 20% or greater and 50% or less) is established. It is preferable that the second-direction high-refractive-index-side incidence width $B_{IN}$ and the second-direction high-refractive-index-side exiting width $B_{EX}$ be such that the relationship in which $((B_{IN}-B_{EX})\times2)/P_B$ is 0.2 or greater and 0.5 or less (in percentage, 20% or greater and 50% or less) is established. When $((A_{IN}-A_{EX})\times2)/P_A$ or $((B_{IN}-B_{EX})\times2)/P_B$ is less than 0.2, the effect of suppressing color change may no longer be effectively obtained. When $((A_{IN}-A_{EX})\times2)/P_A$ or $((B_{IN}-B_{EX})\times2)/P_B$ becomes greater than 0.5, front luminance may be reduced.

In the embodiment, the low-refractive-index layer 102 and the high-refractive-index layer 103 are selected so that the difference between the refractive index of the low-refractive-index layer 102 and the refractive index of the high-refractive index layer 103 is in the range of 0.05 or greater and 0.60 or less. When the optical film 100 is combined with the organic LED panel 15, the difference between the refractive index of the low-refractive-index layer 102 and the refractive index of the high-refractive-index layer 103 is preferably 0.05 or greater and 0.50 or less and more preferably 0.10 or greater and 0.20 or less. Even when the optical film 100 is combined with a liquid crystal panel instead of the organic LED panel 15, the difference between the refractive index of the low-refractive-index layer 102 and the refractive index of the high-refractive-index layer 103 is preferably 0.05 or greater and 0.50 or less and more preferably 0.10 or greater and 0.20 or less.

Note that the refractive index of the low-refractive-index layer 102 is, for example, 1.40 or greater and 1.55 or less, and the refractive index of the high-refractive-index layer 103 is, for example, 1.55 or greater and 1.90 or less, and is greater than the refractive index of the low-refractive-index layer 102.

As described above, the optical film 100 is disposed so that the high-refractive-index layer 103 is positioned on a side of incidence light from the organic LED panel 15, and the low-refractive-index layer 102 is positioned on a side of exiting light. In the embodiment, by satisfying Conditions (1) and (2) above, a large amount of light propagating toward the side surfaces 110S of the lens portions 110, which are part of the low-refractive-index layer 102, from the high-refractive-index layer 103 and being totally reflected by the side surfaces 110S is ensured. Here, if the low-refractive-index layer 102 is positioned on the side of incidence light from the organic LED panel 15, and a portion corresponding to the lens portions 110 is formed in the high-refractive-index layer 103, it becomes difficult to ensure a large amount of light to be totally reflected. Therefore, in the optical film 100, the high-refractive-index layer 103 is disposed on the side of the organic LED panel 15.

However, the inventor of the present disclosure has confirmed that, when the low-refractive-index layer 102 is positioned on the side of incidence light from the organic LED panel 15 and the low-refractive-index layer 102 includes the lens portions 110, advantageous optical performance can be realized.

Note that the low-refractive-index layer 102 may be formed by curing, for example, ultraviolet curable resin, electron beam curable resin, or thermosetting resin. When the low-refractive-index layer 102 is formed by curing ultraviolet curable resin, the ultraviolet curable resin may include acrylic resin or epoxy resin.

Similarly, the high-refractive-index layer 103 may be formed by curing, for example, ultraviolet curable resin, electron beam curable resin, or thermosetting resin. When the high-refractive-index layer 103 is formed by curing ultraviolet curable resin, the ultraviolet curable resin may include acrylic resin or epoxy resin. When the high-refractive-index layer 103 is formed as an adhesive layer, the high-refractive-index layer 103 may be made from an acrylic resin adhesive.

The thickness of the layer body 102A of the low-refractive-index layer 102 in the third direction $D_3$ is, for example, 0.5 μm or greater and 30 μm or less. The height of each lens portion 110 is, for example, 1.0 μm or greater and 30 μm or less. On the other hand, the thickness of the high-refractive-index layer 103 is 5 μm or greater and 100 μm or less. Note that the thickness of the high-refractive-index layer 103 is the distance from an end point of the double-cross-shape portion 103B on the side of the low-refractive-index layer 102 to a surface of the layer body 103A on a side opposite to the low-refractive-index layer 102.

Next, operations in the embodiment is described.

When light for forming an image exits from the organic LED panel 15, the light passes through the circularly polarizing plate 20, the touch panel 30, and the cover glass 40, and is incident upon the optical film 100. Of the light incident upon the optical film 100, a light beam propagating toward a flat portion 111 and a light beam propagating toward a flat portion of the layer body 102A between adjacent lens portions 110 in the front view direction exit from the low-refractive-index layer 102 without changing or almost without changing their angles in a propagation direction as shown by symbols L4 and L5 in FIG. 4, and do not contribute to forming an image in front view.

On the other hand, of the light incident upon the optical film 100, a light beam that propagates toward a side surface 110S of a lens portion 110 in the front view direction and light beams that propagate toward the side surface 110S of the lens portion 110 in directions that are inclined by only relatively small angles with respect to the front view direction are totally reflected by the side surface 110S, have their propagation directions changed toward a high angle side, and exit from the low-refractive-index layer 102 as shown by symbols L1 to L3 in FIG. 4. That is, the light beams propagating in the directions that are inclined by relatively small angles with respect to the front view direction propagate toward a higher angle side than before after being totally reflected by the side surface 110S. Therefore, a large quantity of light is prevented from concentrating in the front view direction and thus a good image is formed when viewed in an oblique direction.

Here, in the embodiment, by forming the optical film 100 to satisfy Conditions (1) and (2) above, the lens portions 110 are long in a height direction and the area of each side surface 110S can be large and thus light is easily guided to the side surfaces 110S of the lens portions 110 from locations between adjacent lens portions 110, as a result of which the light can be diffused in a wide range. By providing the flat portions 111 at the ends of the lens portions 110, light propagating in the front view direction is prevented from being undesirably diffused, and thus a reduction in image quality in front view is suppressed. Since each lens portion 110 has a columnar shape tapering toward the side of the high-refractive-index layer 103, color change can be suppressed in a direction that is inclined with respect to the front view direction in the plane including the front view direction and the first direction $D_1$ and in a direction that is inclined with respect to the front view direction in the plane including the front view direction and the second direction $D_2$.

Accordingly, in the present embodiment, it is possible to effectively suppress color change within a viewing angle while maintaining good display quality in front view of the display device.

Modifications of the embodiment above are described below. FIGS. 6 to 9 show modifications of the embodiment above. Structural elements in each modification that are the same as the structural elements described in the embodiment above are given the same reference numerals, and matters other than the differences are not described below.

Figure 6:
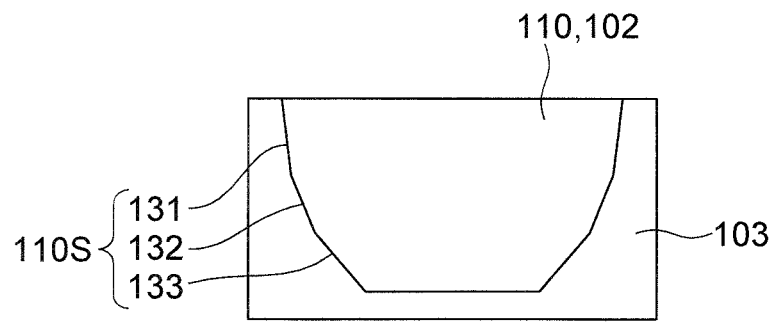
FIG. 6 shows a modification of the optical film shown in FIG. 2.
Figure 7:
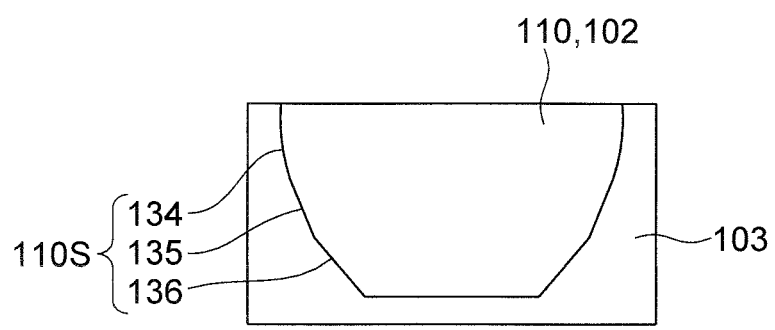
FIG. 7 shows a modification of the optical film shown in FIG. 2.
Figure 8:
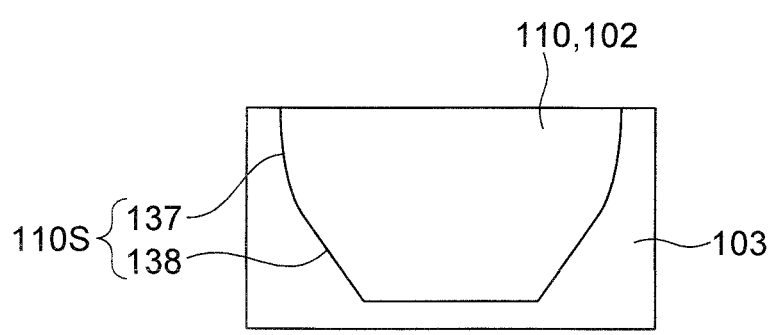
FIG. 8 shows a modification of the optical film shown in FIG. 2.

In the modification shown in FIG. 6, a side surface 110S is a bent surface, and includes a first element surface 131, a second element surface 132, and a third element surface 133, which are three element surfaces each constituted as a plane surface. In the modification shown in FIG. 7, a side surface 110S includes a curved surface 134 and a bent surface including two element surfaces 135 and 136 that are constituted as plane surfaces. In the modification shown in FIG. 8, a side surface 110S includes a curved surface 137 and a plane surface 138.

Figure 9:
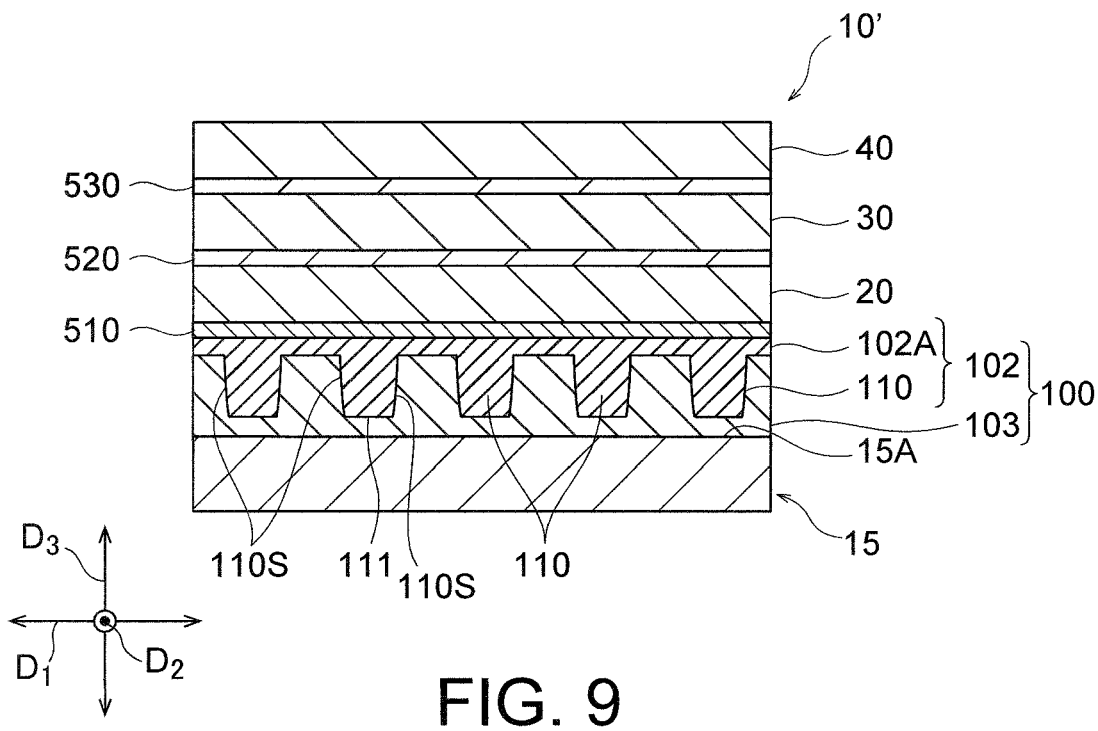
FIG. 9 shows a modification of the display device shown in FIG. 1.

A display device 10' according to the modification shown in FIG. 9 includes an organic LED panel 15, an optical film 100, a circularly polarizing plate 20, a touch panel 30, and a cover glass 40, which are stacked in this order. The optical film 100 is disposed on a display surface (front surface) 15A of the organic LED panel 15. A front surface of the optical film 100 and a back surface of the circularly polarizing plate 20 are adhered to each other with an adhesive layer 510. A front surface of the circularly polarizing plate 20 and a back surface of the touch panel 30 are adhered to each other with an adhesive layer 520. A front surface of the touch panel 30 and a back surface of the cover glass 40 are adhered to each other with an adhesive layer 530. The adhesive layers 510, 520, and 530 are each a so-called OCA (optical clear adhesive), and each have a high light transmittance. Although, in the modification, the organic LED panel 15 and the optical film 100 are not adhered to each other with an adhesive layer, the organic LED panel 15 and the optical film 100 may be adhered to each other with an adhesive layer.

In the display device 10' according to the modification, the circularly polarizing plate 20 is disposed closer than the optical film 100 to outside light incidence side (a side of the cover glass 40). Therefore, when outside light is incident toward the organic LED panel 15 from the cover glass 40, it becomes difficult for the outside light to be incident upon the optical film 100 due to the circularly polarizing plate 20, and thus multiple reflection inside the optical film 100 can be suppressed. Therefore, it is possible to suppress occurrence of visibility hindrance phenomenon, such as iridescent unevenness or interference patterns, and to thus ensure good visibility of an image.

In the embodiment above, each lens portion 110 of the low-refractive-index layer 102 may have a quadrangular pyramidal shape, a conical shape, a hexagonal pyramidal shape, or an octagonal pyramidal shape. The arrangement of the lens portions 110 is not limited to a matrix arrangement, and may be, for example, a houndstooth check arrangement.

When each lens portion 110 is viewed in a normal direction to the low-refractive-index layer 102, in the embodiment above, the flat portion 111 and a base end portion have square shapes. That is, as shown in FIG. 3, when each lens portion 110 is viewed in the normal direction to the low-refractive-index layer 102, the aspect ratio (first maximum width W1:second maximum width W2 in a direction orthogonal to a direction that prescribes the first maximum width W1) of each lens portion 110 (flat portion 111 and base end portion) is 1:1. However, the shape of each lens portion 110 is not limited thereto, and, for example, W1:W2 may be approximately 1:3 to 3:1. The direction that prescribes the first maximum width W1 and the direction that prescribes the second maximum width W2 may be parallel to the first direction $D_1$. When the difference between the first maximum width W1 and the second maximum width W2 is greater than three times, productivity is reduced due to die releasing becoming difficult, and the risk of the lens portions 110 collapsing is increased.

Although each of the display devices 10 and 10' above includes a combination of the organic LED panel 15 and the optical film 100 whose lens portions 110 are arranged two-dimensionally, a liquid crystal panel and the optical film 100 may be combined.

In assembling the display device 10' shown in FIG. 9, an optical-film-provided polarizing film in which the optical film 100 and the circularly polarizing plate 20 are integrated with each other may be previously fabricated. In this case, the low-refractive-index layer 102 of the optical film 100 and the phase difference plate of the circularly polarizing plate 20 are adhered to each other.

Second Embodiment

Figure 10:
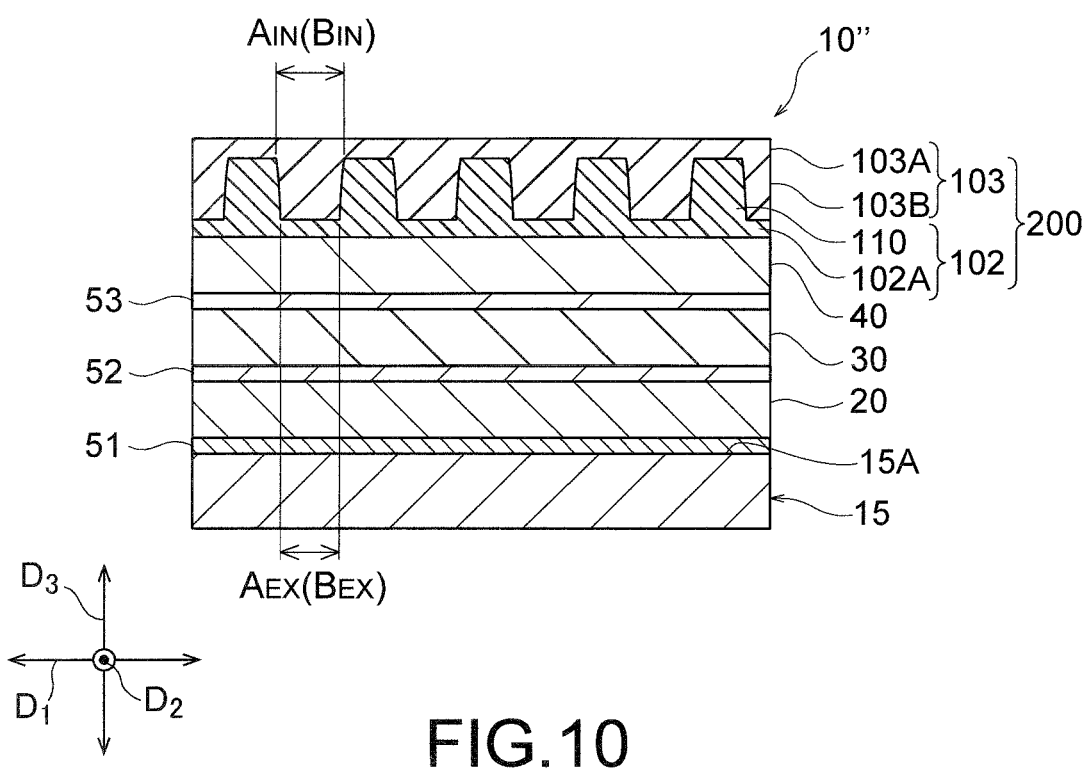
FIG. 10 is a schematic view of a structure of a display device including an optical film according to a second embodiment of the present disclosure.

FIG. 10 is a schematic view of a structure of a display device 10'' including an optical film 200 according to a second embodiment. Structural portions of the present embodiment that are the same as the structural portions of the first embodiment are given the same reference numerals, and are not described.

In the optical film 200 of the display device 10'' according to the second embodiment, the orientations of a low-refractive-index layer 102 and a high-refractive-index layer 103 are opposite to the orientations of the low-refractive-index layer 102 and the high-refractive-index layer 103 of the optical film 100 in the first embodiment. The other structures are the same as those of the first embodiment.

That is, in the optical film 200 of the display device 10'' according to the second embodiment, the low-refractive-index layer 102 is positioned on a side of incidence light from an organic LED panel 15, and includes lens portions 110.

Even in such an optical film 200, by satisfying the following Condition (1) and/or Condition (2) described in the first embodiment, it is possible to effectively suppress color change within a viewing angle while maintaining a good display quality in front view of the display device.

$((P_A-((A_{IN}+A_{EX})/2))\times(P_B-((B_{IN}+B_{EX})/2)))/(P_A \times P_B)$ is 0.42 or greater and 0.70 or less          Condition (1)

$H/((A_{IN}+A_{EX})/2)$, and $H/((B_{IN}+B_{EX})/2)$ are each 1.40 or greater and 3.00 or less          Condition (2)

EXAMPLES

Examples and comparative examples thereof are described below.

Optical films according to Examples 1 to 4 have shapes that are the same as those described in the first embodiment above, and include quadrangular pyramidal lens portions 110 that are arranged in a matrix at equal pitches of 8.6 μm in both the first direction $D_1$ and the second direction $D_2$. The lens portions 110 have a regular quadrangular pyramidal shape and flat portions 111 have a square shape.

Low-refractive-index layers 102 are made of a resin having a refractive index of 1.48, and high-refractive-index layers 103 are made of a resin having a refractive index of 1.65.

In the optical films according to Examples 1 to 4, the slope ratio determined by $((P_A-((A_{IN}+A_{EX})/2))\times(P_B-(B_{IN}+B_{EX})/2)))/(P_A \times P_B)$ becomes 0.42 or greater and 0.70 or less, and the average aspect in sectional view in the first direction determined by $H/((A_{IN}+A_{EX})/2)$ and the average aspect in sectional view in the second direction determined by $H/((B_{IN}+B_{EX})/2)$ are each 1.40 or greater and 3.00 or less.

Note that, since each lens portion 110 has a regular quadrangular pyramidal shape, the average aspect in sectional view in the first direction and the average aspect in sectional view in the second direction have the same value. Hereunder, the term "average aspect" when simply used means both the average aspect in sectional view in the first direction and the average aspect in sectional view in the second direction.

An optical film according to Example 5 has the same shape as that described in the second embodiment above, and includes quadrangular pyramidal lens portions 110 that are arranged in a matrix at equal pitches of 8.6 μm in both the first direction $D_1$ and the second direction $D_2$. The lens portions 110 have a regular quadrangular pyramidal shape and flat portions 111 have a square shape.

A low-refractive-index layer 102 is made of a resin having a refractive index of 1.48, and a high-refractive-index layer 103 is made of a resin having a refractive index of 1.65.

Example 5 differs from Examples 1 to 4 in that, whereas, in Examples 1 to 4, the high-refractive-index layer 103 is positioned on a side of a light source (display panel), in Example 5, the low-refractive-index layer 102 is positioned on the side of the light source (display panel).

In the optical film according to Example 5, although the slope ratio is 0.42 or greater and 0.70 or less, the average aspect falls outside the range of 1.40 or greater and 3.00 or less.

In Comparative Examples 1 to 4, regular quadrangular pyramidal lens portions are provided, and are arranged in a matrix at equal pitches of 8.6 μm in both the first direction $D_1$ and the second direction $D_2$. However, the slope ratio falls outside the range of 0.42 or greater and 0.70 or less, and the average aspect falls outside the range of 1.40 or greater and 3.00 or less. Note that formation materials are the same as those of the examples. That is, in Comparative Examples 1 to 4, although the basic shapes are the same as those in Examples 1 to 4, the slope ratio falls outside the range of 0.42 or greater and 0.70 or less and the average aspect falls outside the range of 1.40 or greater and 3.00 or less.

In Comparative Examples 5 and 6, regular quadrangular pyramidal lens portions are provided, and are arranged in a matrix at equal pitches of 8.6 μm in both the first direction $D_1$ and the second direction $D_2$. However, the slope ratio falls outside the range of 0.42 or greater and 0.70 or less, and the average aspect falls outside the range of 1.40 or greater and 3.00 or less. Moreover, the positions of dispositions of a low-refractive-index layer and a high-refractive-index layer are opposite to those in Examples 1 to 4. Specifically, the low-refractive-index layer includes the lens portions. That is, in Comparative Examples 5 and 6, the low-refractive-index layer and the high-refractive-index layer are disposed in this order from a side of a light source ("L high low" in Table 1 below means that the low-refractive-index layer and the high-refractive-index layer are disposed side by side in this order from the side of the light source). Note that formation materials are the same as those in Examples 1 to 5. Specifically, in Comparative Examples 5 and 6, although the basic shapes are the same as that in Example 5, the slope ratio falls outside the range of 0.42 or greater and 0.70 or less and the average aspect falls outside the range of 1.40 or greater and 3.00 or less.

The examples and the comparative examples were evaluated from the viewpoints of luminance and color change. The luminance was evaluated by comparing the luminance (front luminance) in a front view direction of an image displayed by an organic LED display panel to which an optical film was attached with the front luminance of the same image displayed by an organic LED display panel to which an optical film was not attached, and by calculating the ratio of the former to the latter.

The color change was evaluated by comparing the color change Δu'v' when an image displayed by the organic LED display panel to which an optical film was not attached was viewed from a direction inclined by 45 degrees with respect to the front view direction with the color change Δu'v' when the same image displayed by the organic LED display panel to which an optical film was attached was viewed from the direction inclined by 45 degrees with respect to the front view direction.

When evaluating the luminance and the color change, a white image was displayed on the entire organic LED display panel.

As a device for measuring the luminance and the color change, CS-1000 manufactured by KONICA MINOLTA, INC. was used.

Figure 11:
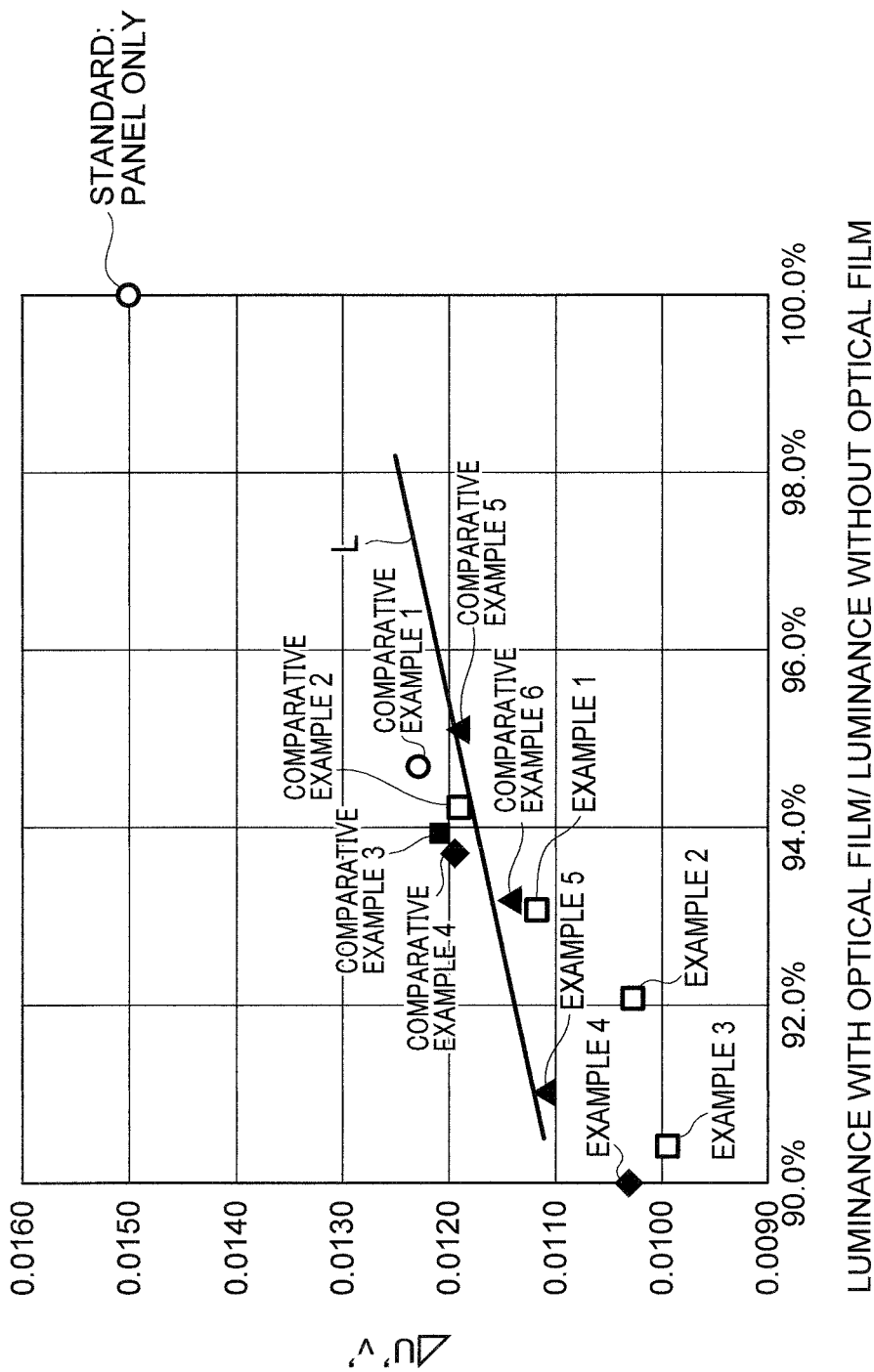
FIG. 11 is a graph describing the relationships between the shapes, luminance, and color change of optical films according to examples and comparative examples.

Dimensional conditions, the slope ratio, the average aspect, the ratio (%) of front luminance with optical film/front luminance without optical film, and the values of color change of the examples and the comparative examples are shown in Table 1 below. Note that the slopes during display corresponds to side surfaces. Although each lens portion has a regular quadrangular pyramidal shape, the side surfaces are curved surfaces and have their curvatures determined. FIG. 11 is a graph showing the ratio of front luminance with optical film/front luminance without optical film, and the values of color change, with the horizontal axis indicating the ratio of front luminosities and the vertical axis indicating the values of color change.

"High-refractive-index-side exiting width" in the table regarding Example 5 corresponds the symbol $A_{IN}(B_{IN})$ in FIG. 10, and "high-refractive-index-side incidence width" in the table regarding Example 5 corresponds to the symbol $A_{EX}(B_{EX})$ in FIG. 10. That is, "high-refractive-index-side exiting width" and "high-refractive-index-side incidence width" in the table regarding Example 5 are determined in accordance with the definitions described in the first embodiment above. Note that "high-refractive-index-side exiting width" and "high-refractive-index-side incidence width" in the table regarding Comparative Examples 5 and 6 are also determined similarly to Example 5.

TABLE 1

| | STANDARD: PANEL ONLY | EXAMPLE 1 | EXAMPLE 2 | EXAMPLE 3 | EXAMPLE 4 | EXAMPLE 5 | COMPARATIVE EXAMPLE 1 |
|---|---|---|---|---|---|---|---|
| FILM STRUCTURE | | L HIGH LOW | L HIGH LOW | L HIGH LOW | L HIGH LOW | L LOW HIGH | L HIGH LOW |
| PITCH (μm) | | 8.6 | 8.6 | 8.6 | 8.6 | 8.6 | 8.6 |
| SLOPE ANGLE | | 7.9 | 7.9 | 7.9 | 5.8 | 12.1 | 9.7 |
| AVERAGE SLOPE CURVATURE RADIUS (μm) | | 20.0 | 20.0 | 20.0 | 40.0 | 15.0 | 20.4 |
| HIGH-REFRACTIVE-INDEX-SIDE EXITING WIDTH (μm) | | 2.4 | 1.6 | 0.8 | 1.6 | 1.8 | 3.6 |
| HIGH-REFRACTIVE-INDEX-SIDE INCIDENCE WIDTH (μm) | | 3.6 | 2.8 | 2.0 | 2.8 | 3.1 | 4.9 |
| HEIGHT (μm) | | 4.2 | 4.2 | 4.2 | 4.5 | 3.0 | 3.7 |
| SLOPE RATIO | | 0.42 | 0.55 | 0.70 | 0.55 | 0.51 | 0.26 |
| AVERAGE ASPECT | | 1.40 | 1.91 | 3.00 | 2.05 | 1.22 | 0.87 |
| FRONT LUMINANCE | 100.0% | 93.1% | 92.1% | 90.4% | 90.0% | 91.0% | 94.7% |
| Δu'v' | 0.0150 | 0.0112 | 0.0103 | 0.0099 | 0.0103 | 0.0111 | 0.0123 |
| COLOR CHANGE SUPPRESSION RATIO(%) | | 74 | 68 | 66 | 69 | 74 | 82 |

TABLE 1-continued

|  | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 |
|---|---|---|---|---|---|
| FILM STRUCTURE | L HIGH LOW | L HIGH LOW | L HIGH LOW | L LOW HIGH | L LOW HIGH |
| PITCH (μm) | 8.6 | 8.6 | 8.6 | 8.6 | 8.6 |
| SLOPE ANGLE AVERAGE | 7.9 | 6.5 | 5.8 | 12.1 | 9.7 |
| SLOPE CURVATURE RADIUS (μm) | 20.0 | 20.0 | 40.0 | 15.0 | 20.4 |
| HIGH-REFRACTIVE-INDEX-SIDE EXITING WIDTH (μm) | 3.4 | 3.4 | 3.6 | 2.5 | 3.6 |
| HIGH-REFRACTIVE-INDEX-SIDE INCIDENCE WIDTH (μm) | 4.6 | 4.6 | 4.8 | 4.3 | 4.9 |
| HEIGHT (μm) | 4.2 | 4.4 | 4.5 | 4.1 | 3.7 |
| SLOPE RATIO | 0.29 | 0.29 | 0.26 | 0.37 | 0.26 |
| AVERAGE ASPECT | 1.05 | 1.10 | 1.07 | 1.21 | 0.87 |
| FRONT LUMINANCE | 94.2% | 93.9% | 93.7% | 95.1% | 93.2% |
| Δu'v' | 0.0119 | 0.0121 | 0.0120 | 0.0119 | 0.0114 |
| COLOR CHANGE SUPPRESSION RATIO(%) | 79 | 80 | 80 | 79 | 76 |

In Examples 1 to 4, as indicated by the color change suppression ratio, the color change Δu'v' when the image is viewed from the direction inclined by 45 degrees with respect to the front view direction can be suppressed to 75% or less with respect to the color change without an optical film. The luminance here is 90% or greater of the luminance without an optical film, and a reduction in the luminance in front view is suppressed. The effects of the present disclosure has been confirmed from such results of the examples.

In Example 5, the color change Δu'v' when the image is viewed from the direction inclined by 45 degrees with respect to the front view direction can be suppressed to 75% or less with respect to the color change without an optical film. Note that, although the slope ratio is 0.51 in Example 5, it is presumed that, even for the slope ratios of Examples 1 to 4 within a range of 0.42 to 0.70, good color change suppression effects are provided. Although the average aspect in Example 5 is 1.22 and falls outside the range of 1.40 or greater and 3.00 or less, when the range is 1.40 or greater and 3.00 or less, it is presumed that, due to the lens portions 110 not being too pointed while ensuring a large area of each side surface 110S, the effects of suppressing color change and suppressing a reduction in front luminance can be increased.

A straight line L in FIG. 11 indicates the tendency of the optical films according to Comparative Examples 5 and 6 in which the low-refractive-index layer and the high-refractive-index layer are disposed in this order from the side of the light source. Examples 1 to 4 are positioned below the straight line L, and the optical films in Examples 1 to 4 can suppress color change by a greater degree than the optical films in Example 5 and Comparative Examples 5 and 6 in which the low-refractive-index layer and the high-refractive-index layer are disposed in this order from the side of the light source. From the results, it has been confirmed that greater color change suppression effects are obtained when the high-refractive-index layer 103 is positioned on the side of the light source (display panel) than when the low-refractive-index layer 102 is positioned on the side of the light source (display panel).

(Simulation)

In the optical film 100 of the first embodiment, the high-refractive-index layer 103 facing the side of the light source includes a double-cross-shape portion 103B and the low-refractive-index layer 102 includes lens portions 110. In a simulation to be described below, the effectiveness of such a form of the first embodiment was examined by comparison with a simulation Comparative Example X. The simulation Comparative Example X is an optical film in which lens portions are provided in a high-refractive-index layer facing a side of a light source and a low-refractive-index layer is stacked thereupon has a double-cross shape.

In the lens portions 110 of the optical film 100 of the first embodiment to be the object of simulation, the following dimensional conditions were set. Note that the high-refractive-index-side exiting width and the high-refractive-index-side incidence width become the same values in both the first direction $D_1$ and the second direction $D_2$.

Lens portions have regular quadrangular pyramidal shapes.
Pitch: 8.6 μm (in both the first direction $D_1$ and the second direction $D_2$)
Slope angle average: 12.1 (degrees)
Slope curvature radius: 15 (μm)
High-refractive-index-side exiting width: 1.8 (μm)
High-refractive-index-side incidence width: 3.1 (μm)
Height: 3 (μm)
Slope ratio: 51(%)
Average aspect: 1.22

In the lens portions of the simulation Comparative Example X, the following dimensional conditions were set. The high-refractive-index-side exiting width and the high-refractive-index-side incidence width become the same values in both the first direction $D_1$ and the second direction $D_2$.

Lens portions have regular quadrangular pyramidal shapes.
Pitch: 8.6 μm (in both the first direction D₁ and the second direction D₂)
Slope angle average: 12.1 (degrees)
Slope curvature radius: 15 (μm)
High-refractive-index-side exiting width: 5.5 (μm)
High-refractive-index-side incidence width: 6.8 (μm)
Height: 3 (μm)
Slope ratio: 8(%)
Average aspect: 0.48
*Note that the "high-refractive-index-side exiting width" of the simulation Comparative Example X is calculated in accordance with the definition described in the first embodiment above by the distance in the first direction D₁ (second direction D₂) between flat portions 111 of lens portions 110 that are adjacent to each other in the first direction D₁ (second direction D₂).

Similarly, the "high-refractive-index-side incidence width" of the simulation Comparative Example X is calculated in accordance with the definition described in the first embodiment above by the distance in the first direction D₁ (second direction D₂) between end portions of lens portions 110 that are adjacent to each other in the first direction D₁ (second direction D₂), the end portions being situated on a side opposite to the flat portions 111.

In the simulation results, the color changes Δu'v' with respect to a front view at a plurality of visibility angles (45 degrees, 30 degrees, 15 degrees) inclined with respect to the front view were calculated. Table 2 below shows the simulation results.

TABLE 2

|  | FIRST EMBODIMENT | SIMULATION COMPARATIVE EXAMPLE X |
|---|---|---|
| COLOR CHANGE (VISIBILITY ANGLE: 45 DEGREES) | 0.0110 | 0.0139 |
| COLOR CHANGE (VISIBILITY ANGLE: 35 DEGREES) | 0.0066 | 0.0069 |
| COLOR CHANGE (VISIBILITY ANGLE: 15 DEGREES) | 0.0018 | 0.0019 |

According to the simulation results above, in the first embodiment, for each of the visibility angles, the degree of color change is smaller than that in the simulation Comparative Example X, and the color change is effectively suppressed. From such simulation results, it has been confirmed that the double-cross-shape portion 103B of the high-refractive-index layer 103, which faces the side of the light source, and the lens portions 110 of the low-refractive-index layer 102 are effective in suppressing color change than when the lens portions are arranged at the high-refractive-index layer.

REFERENCE SIGNS LIST 10 display device
15 organic LED panel
15A display surface
20 circularly polarizing plate
30 touch panel
40 cover glass
51 first adhesive layer
52 second adhesive layer
53 third adhesive layer
100 optical film
102 low-refractive-index layer
102A layer body
103 high-refractive-index layer
103A layer body
103B double-cross-shape portion
110 lens portion
110S side surface
111 flat portion
131 first element surface
132 second element surface
133 third element surface
134 curved surface
135, 136 element surface
137 curved surface
138 plane surface

The invention claimed is:

1. An optical film comprising: a low-refractive-index layer that includes a plurality of lens portions; and a high-refractive-index layer that is provided so as to fill a space between the plurality of lens portions, and that has a refractive index higher than a refractive index of the low-refractive-index layer,
wherein each lens portion has a columnar shape tapering toward a side of the high-refractive-index layer, and includes a flat portion at an end thereof on the side of the high-refractive-index layer, the flat portion being parallel to a film surface of the optical film,
wherein the plurality of lens portions are arranged two-dimensionally in a first direction that is parallel to the film surface and in a second direction that is orthogonal to the first direction, and
wherein when a distance in the first direction between the flat portions of the lens portions that are adjacent to each other in the first direction is $A_{IN}$,
when a distance in the first direction between end portions of the lens portions that are adjacent to each other in the first direction is $A_{EX}$, the end portions being situated on a side opposite to the flat portions,
when a first-direction pitch that is a distance in the first direction between midpoints in the first direction of the lens portions that are adjacent to each other in the first direction is $P_A$,
when a distance in the second direction between the flat portions of the lens portions that are adjacent to each other in the second direction is $B_{IN}$,
when a distance in the second direction between end portions of the lens portions that are adjacent to each other in the second direction is $B_{EX}$, the end portions being situated on the side opposite to the flat portions, and
when a second-direction pitch that is a distance in the second direction between midpoints in the second direction of the lens portions that are adjacent to each other in the second direction is $P_B$, $((P_A-((A_{IN}+A_{EX})/2))\times(P_B-((B_{IN}+B_{EX})/2)))/(P_A\times P_B)$ is 0.42 or greater and 0.70 or less.

2. The optical film according to claim 1, wherein, when a height of each lens portion is H, $H/((A_{IN}+A_{EX})/2)$ and $H/((B_{IN}+B_{EX})/2)$ are each 1.40 or greater and 3.00 or less.

3. An optical film comprising: a low-refractive-index layer that includes a plurality of lens portions; and a high-refractive-index layer that is provided so as to fill a space between the plurality of lens portions, and that has a refractive index higher than a refractive index of the low-refractive-index layer, wherein each lens portion has a columnar shape tapering toward a side of the high-refractive-index layer, and includes a flat portion at an end thereof on the side of the high-refractive-index layer, the flat portion being parallel to a film surface of the optical film, wherein the plurality of lens portions are arranged two-dimensionally in a first direction that is parallel to the film surface and in a second direction that is orthogonal to the first direction, and wherein when a distance in the first direction between the flat portions of the lens portions that are adjacent to each other in the first direction is $A_{IN}$, a distance in the first direction between end portions of the lens portions that are adjacent to each other in the first direction is $A_{EX}$, the end portions being situated on a side opposite to the flat portions, a distance in the second direction between the flat portions of the lens portions that are adjacent to each other in the second direction is $B_{IN}$, a distance in the second direction between end portions of the lens portions that are adjacent to each other in the second direction is $B_{EX}$, the end portions being situated on the side opposite to the flat portions, and a height of each lens portion is H, $H/((A_{IN}+A_{EX})/2)$ and $H/((B_{IN}+B_{EX})/2)$ are each 1.40 or greater and 3.00 or less.

4. The optical film according to claim 1, wherein the flat portions of the lens portions are disposed so as to face a side of a display panel.

5. The optical film according to claim 1, wherein the plurality of lens portions are arranged in a matrix, and the high-refractive-index layer includes a double-cross-shape portion.

6. The optical film according to claim 1, wherein each lens portion has a quadrangular pyramidal shape, and each flat portion has a square shape.

7. The optical film according to claim 1, wherein each lens portion has a quadrangular pyramidal shape, and each flat portion has a rectangular shape.

8. The optical film according to claim 1, wherein a side surface of each lens portion is a curved surface that protrudes toward the side of the high-refractive-index layer.

9. An optical film comprising: a low-refractive-index layer that includes a plurality of lens portions; and a high-refractive-index layer that is provided so as to fill a space between the plurality of lens portions, and that has a refractive index higher than a refractive index of the low-refractive-index layer, wherein each lens portion has a columnar shape tapering toward one side of the optical film, the one side being a side in a normal direction to a film surface of the optical film, and includes a flat portion at an end thereof on the one side, the flat portion being parallel to the film surface, wherein the plurality of lens portions are arranged two-dimensionally in a first direction that is parallel to the film surface and in a second direction that is orthogonal to the first direction, and wherein when a distance in the first direction between the flat portions of the lens portions that are adjacent to each other in the first direction is $A_{IN}$, when a distance in the first direction between end portions of the lens portions that are adjacent to each other in the first direction is $A_{EX}$, the end portions being situated on a side opposite to the flat portions, when a first-direction pitch that is a distance in the first direction between midpoints in the first direction of the lens portions that are adjacent to each other in the first direction is $P_A$, when a distance in the second direction between the flat portions of the lens portions that are adjacent to each other in the second direction is $B_{IN}$, when a distance in the second direction between end portions of the lens portions that are adjacent to each other in the second direction is $B_{EX}$, the end portions being situated on the side opposite to the flat portions, and when a second-direction pitch that is a distance in the second direction between midpoints in the second direction of the lens portions that are adjacent to each other in the second direction is $P_B$, $((P_A-((A_{IN}+A_{EX})/2))\times(P_B-((B_{IN}+B_{EX})/2)))/(P_A\times P_B)$ is 0.42 or greater and 0.70 or less.

10. The optical film according to claim 9, wherein, when a height of each lens portion is H, $H/((A_{IN}+A_{EX})/2)$ and $H/((B_{IN}+B_{EX})/2)$ are each 1.40 or greater and 3.00 or less.

11. An optical film comprising: a low-refractive-index layer that includes a plurality of lens portions; and a high-refractive-index layer that is provided so as to fill a space between the plurality of lens portions, and that has a refractive index higher than a refractive index of the low-refractive-index layer, wherein each lens portion has a columnar shape tapering toward one side of the optical film, the one side being a side in a normal direction to a film surface of the optical film, and includes a flat portion at an end thereof on the one side, the flat portion being parallel to the film surface, wherein the plurality of lens portions are arranged two-dimensionally in a first direction that is parallel to the film surface and in a second direction that is orthogonal to the first direction, and wherein when a distance in the first direction between the flat portions of the lens portions that are adjacent to each other in the first direction is $A_{IN}$, a distance in the first direction between end portions of the lens portions that are adjacent to each other in the first direction is $A_{EX}$, the end portions being situated on a side opposite to the flat portions, a distance in the second direction between the flat portions of the lens portions that are adjacent to each other in the second direction is $B_{IN}$, a distance in the second direction between end portions of the lens portions that are adjacent to each other in the second direction is $B_{EX}$, the end portions being situated on the side opposite to the flat portions, and a height of each lens portion is H, $H/((A_{IN}+A_{EX})/2)$ and $H/((B_{IN}+B_{EX})/2)$ are each 1.40 or greater and 3.00 or less.

12. A display device comprising:
the optical film according to claim 1; and
an organic LED panel having the optical film provided at a display surface.

13. A display device comprising:
the optical film according to claim 1; and
a liquid crystal panel having the optical film provided at a display surface.

14. An optical-film-provided polarizing plate comprising:
the optical film according to claim 1; and
the polarizing plate adhered to the optical film.

* * * * *